US008598915B1

(12) United States Patent
Abuelma'atti et al.

(10) Patent No.: US 8,598,915 B1

(45) Date of Patent: Dec. 3, 2013

(54) CMOS PROGRAMMABLE NON-LINEAR FUNCTION SYNTHESIZER

(75) Inventors: Muhammad Taher Abuelma'atti, Dhahran (SA); Abdullah Muhammad Taher Abuelmaatti, Romsgrove (GB)

(73) Assignee: King Fahd University of Petroleum and Minerals, Dhahran (SA)

( * ) Notice: Subject to any disclaimer, the term of this patent is extended or adjusted under 35 U.S.C. 154(b) by 10 days.

(21) Appl. No.: 13/482,875

(22) Filed: May 29, 2012

(51) Int. Cl.
*H03B 21/00* (2006.01)

(52) U.S. Cl.
USPC ............ 327/105; 327/355; 327/349; 708/846

(58) Field of Classification Search
None
See application file for complete search history.

(56) References Cited

U.S. PATENT DOCUMENTS

| | | | | |
|---|---|---|---|---|
| 3,636,338 | A * | 1/1972 | Abnett et al. | 708/846 |
| 5,271,090 | A * | 12/1993 | Boser | 706/26 |
| 5,581,210 | A * | 12/1996 | Kimura | 327/355 |
| 5,774,010 | A * | 6/1998 | Kimura | 327/356 |
| 5,909,136 | A * | 6/1999 | Kimura | 327/356 |
| 5,912,834 | A * | 6/1999 | Kimura | 708/835 |
| 5,925,094 | A * | 7/1999 | Kimura | 708/835 |
| 6,581,085 | B1 * | 6/2003 | Yue et al. | 708/502 |
| 7,454,450 | B2 * | 11/2008 | Remy et al. | 708/103 |
| 7,533,140 | B2 * | 5/2009 | Jaber | 708/322 |
| 7,937,429 | B2 * | 5/2011 | Lu | 708/819 |
| 7,952,395 | B2 | 5/2011 | Abuelma'atti et al. | |
| 2004/0239398 | A1 * | 12/2004 | Gilbert | 327/349 |
| 2006/0290417 | A1 * | 12/2006 | Choi et al. | 327/543 |

OTHER PUBLICATIONS

*New four-quadrant CMOS current-mode and voltage made multipliers, Analog Intergrated Circuits and Signal Processing*, vol. 45, 2005, pp. 295-307, authored by M.A. Hashiesh, S.A. Mahmoud and A.M. Soliman, (Dec. 2004).

* cited by examiner

*Primary Examiner* — Tuan T Lam

(74) *Attorney, Agent, or Firm* — Richard C. Litman

(57) ABSTRACT

The CMOS programmable non-linear function synthesizer utilizes CMOS current-mode electronics to provide synthesis of arbitrary analog functions. The circuit approximates a seventh-order Taylor series expansion to synthesize an arbitrary nonlinear function. Each term of the Taylor series expansion is realized using a current-mode basic building block, and the output weighted currents of these basic building blocks are algebraically added in addition to a DC current, if needed. The CMOS current mode electronic circuit can be easily integrated, extended to include higher order terms of the Taylor series, and programmed to generate arbitrary nonlinear functions.

9 Claims, 8 Drawing Sheets

CMOS PROGRAMMABLE NON-LINEAR FUNCTION SYNTHESIZER

BACKGROUND OF THE INVENTION

1. Field of the Invention

The present invention relates generally to function synthesizers, and particularly to a CMOS (complementary metal oxide semiconductor) programmable non-linear function synthesizer that can realize arbitrary nonlinear functions using programmable transistor squaring units without dedicated current multipliers.

2. Description of the Related Art

U.S. Pat. No. 7,952,395, issued to the present first-named inventor, Muhammad Taher Abuelma'atti et al, on May 31, 2011, discloses a universal CMOS current-mode analog function synthesizer. The proposed circuit of U.S. Pat. No. 7,952,395 is based upon the fact that numerous nonlinear functions can be approximated, to a high degree of accuracy, using a few terms of their Taylor series expansion.

Moreover, U.S. Pat. No. 7,952,395 teaches how to provide current multipliers having reasonable bandwidth and low complexity (thus, low power consumption), while eliminating the need to trim out the feed-through terms (offset currents) and while eliminating the necessity to adjust the scale factor (the multiplier gain). Yet there remains the problem of how to program such a device for arbitrary functions, not just the thirty-two functions shown in the patent.

Thus, a CMOS programmable non-linear function synthesizer solving the aforementioned problems is desired.

SUMMARY OF THE INVENTION

The CMOS programmable non-linear function synthesizer utilizes CMOS current-mode electronics to provide synthesis of arbitrary analog functions. The circuit approximates a seventh-order Taylor series expansion to synthesize an arbitrary nonlinear function. Each term of the Taylor series expansion is realized using a current-mode basic building block, and the output weighted currents of these basic building blocks are algebraically added, in addition to a DC current, if needed. The CMOS current-mode electronic circuit can be easily integrated, extended to include higher order terms of the Taylor series, and programmed to generate arbitrary nonlinear functions.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 4:
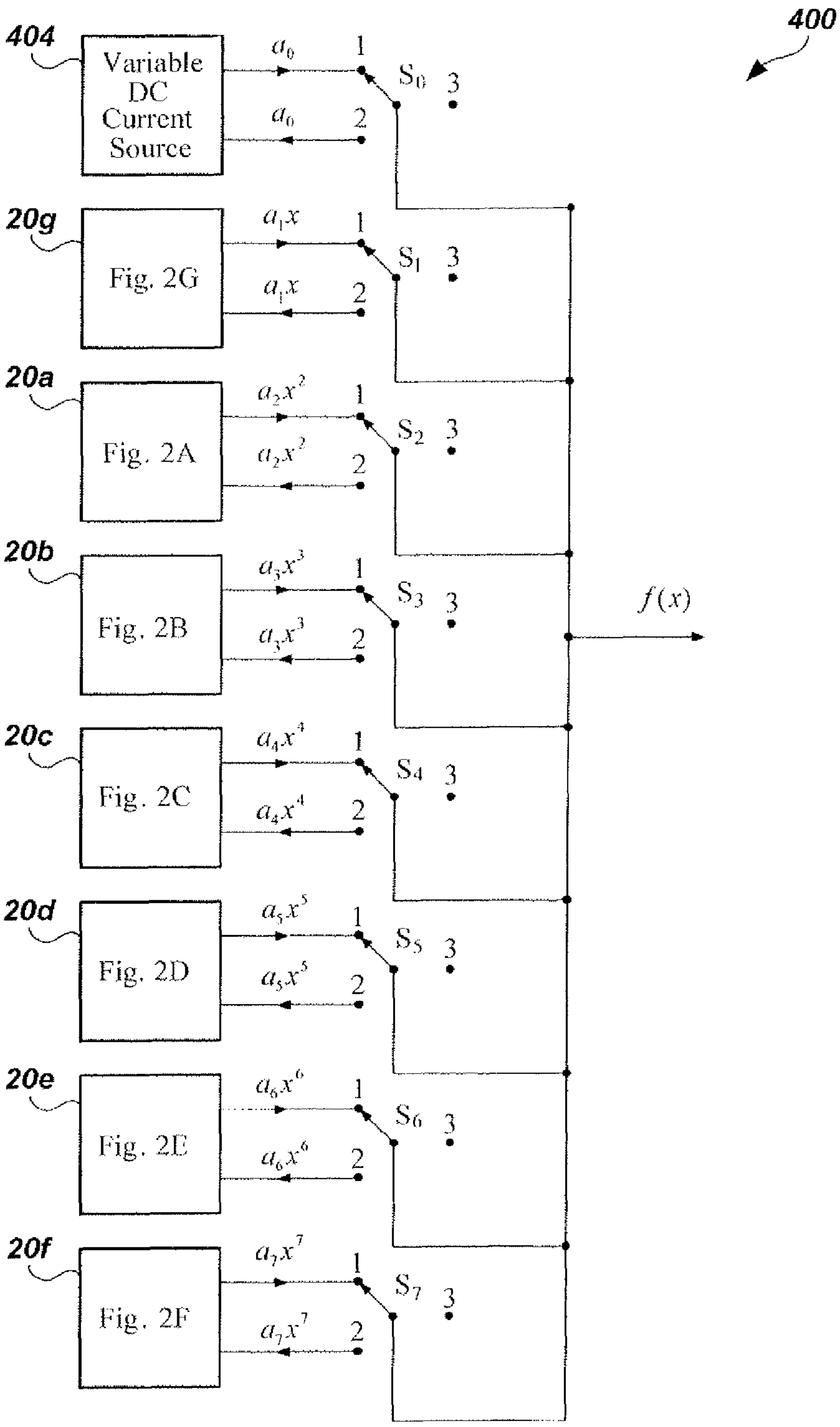
FIG. 4 is a schematic diagram of an exemplary CMOS programmable non-linear function synthesizer according to the present invention.

As shown in FIG. 4, the CMOS programmable non-linear function synthesizer 400 uses current-mode basic building block stages 20*a*-20*g* and the output weighted currents of these basic building block stages to perform algebraic addition, together with a variable DC current source 404, if needed, to thereby allow numerous nonlinear functions to be approximated to a high degree of accuracy using the Taylor series expansion of the form $$f(x) \cong y = a_0 + a_1x + a_2x^2 + a_3x^3 + a_4x^4 + a_5x^5 + a_6x^6 + a_7x^7 + a_nx^n \quad \text{where } |x| < 1 \tag{1}$$

Details and theory of operation of a prior art Taylor series expansion nonlinear function generation approach are included in U.S. Pat. No. 7,952,395, issued to Muhammad Taber Abuelma'atti et al, on May 31, 2011, which is hereby incorporated by reference in its entirety. In current mode, when the variable x represents the normalized input current, equation (1) can be implemented by adding a DC current component to the weighted output currents of a number of power-factor raising circuits with power factors=1, 2, . . . , 7, and using current amplifiers (or attenuators). This method can successfully generate several mathematical functions where the power-factor raising circuits and the current amplifiers (or attenuators) are obtained by successive use of a current squaring circuit obtained from a modified version of a traditional class-AB current mirror. However, while the original version of this class AB current mirror can provide two output currents, one proportional to the input current and the other proportional to the square of the input current, control of the weighting factors of these two currents is feasible only through the simultaneous control of three strictly related currents. This is practically not feasible. Thus, the circuit of the '395 patent is suitable only for generating pre-specified mathematical functions with fixed values of the weighting factors and cannot be easily programmed to generate arbitrary non-linear functions.

Figure 1A:
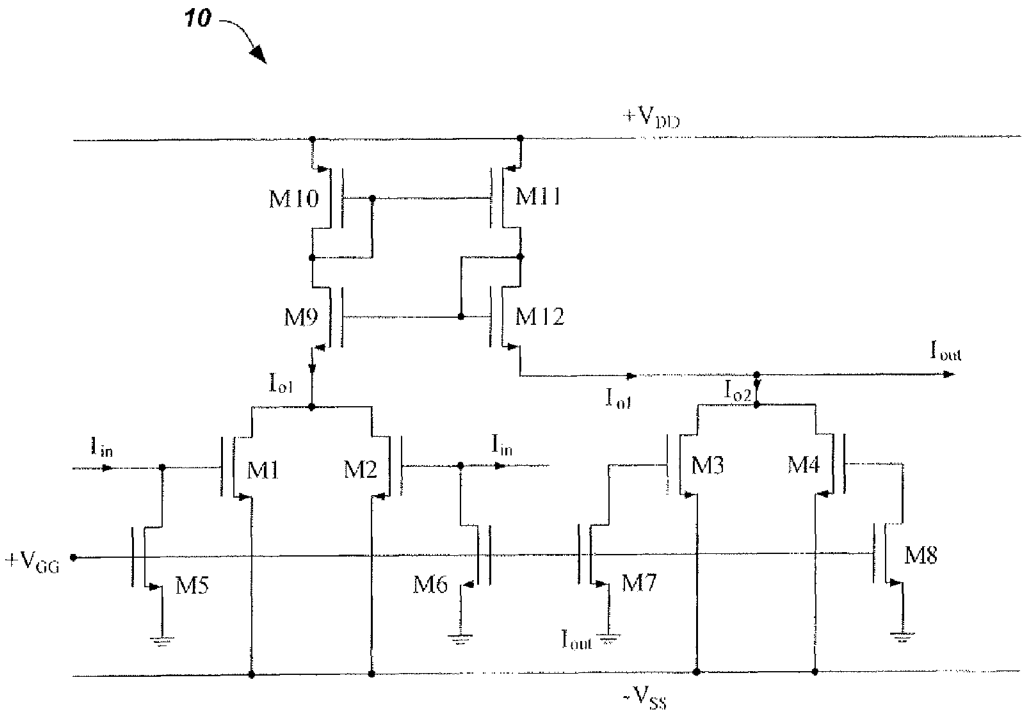
FIG. 1A is a schematic diagram of a CMOS circuit implementing a squaring unit used repetitively in a CMOS programmable non-linear function synthesizer according to the present invention.
Figure 1B:
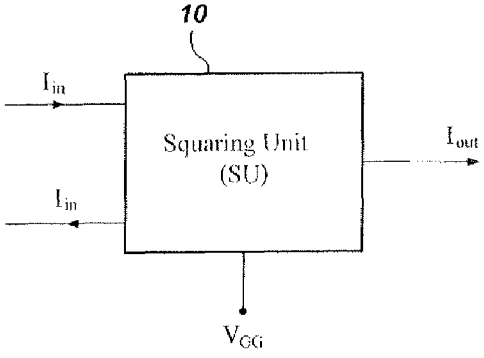
FIG. 1B is a symbol used herein to schematically represent the squaring unit circuit of FIG. 1A.

Thus, in order to realize a programmable nonlinear function synthesizer, it is essential to have a squaring circuit with easy control over the weighting factor of its output current. The squaring unit circuit 10 shown in FIGS. 1A-1B is a novel modification of the multiplier circuits previously known in the art, specifically, it is a modification of the current-mode squarer cell (CSC) circuitry detailed in "New four-quadrant CMOS current-mode and voltage-mode multipliers", *Analog Integrated Circuits and Signal Processing*, Vol. 45, (2005), pp. 295-307, authored by M. A. Hashiesh, S. A. Mahmoud and A. M. Soliman, which is hereby incorporated by reference in its entirety. The benefit of this squaring unit circuit over the squaring unit circuit in the '395 patent is that it has a controllable scaling factor that can be adjusted by an external voltage so that the shape of the non-linear function can be programmably controlled by adjusting external voltages, thereby permitting a programmable non-linear function synthesizer.

With respect to the operation of the SU 10, if it is assumed that transistors M1 and M2 are identical and working in the saturation region, and transistors M5 and M6 are also identical to each other but operating in the linear region, then the current $I_{o1}$ can be expressed as:

$$I_{o1}=k_1R^2I_{in}{}^2+k_1(V_{SS}+V_{th})^2 \tag{2}$$

In equation (2), $k_1$ is the transconductance parameter of transistors M1 and M2, and R is the equivalent resistance of the transistors M5 and M6, which is given by:

$$R=\frac{1}{k_3(V_{GG}-V_{th})} \tag{3}$$

when the transistors M5 and M6 are working in the linear region, and where $k_3$ is the transconductance parameter of transistors M5 and M6. In equations (2) and (3), $V_{th}$ is the threshold voltage of the concerned transistors. Moreover, assuming that transistors M3 and M4 are identical and working in the saturation region, then the current $I_{o2}$ can be expressed as:

$$I_{o2}=k_1(V_{SS}+V_{th})^2 \tag{4}$$

In equation (4), $V_{th}$ is the threshold voltage and $k_1$ is the transconductance parameter of transistors M3 and M4. This implies that transistors M1-M4 are identical. M1, M2, M5, M6 are configured as a first squaring circuit. M3, M4, M7, and M8 are configured as a second squaring circuit in the SU circuit 10. Transistors M9-M12 are configured as a current-mirror.

Combining equations (2)-(4), the output current of the squaring circuit of FIGS. 1A-1B can be expressed as:

$$I_{out}=\frac{k_1}{k_3^2(V_{GG}-V_{th})^2}I_{in}^2. \tag{5}$$

Figure 2A:
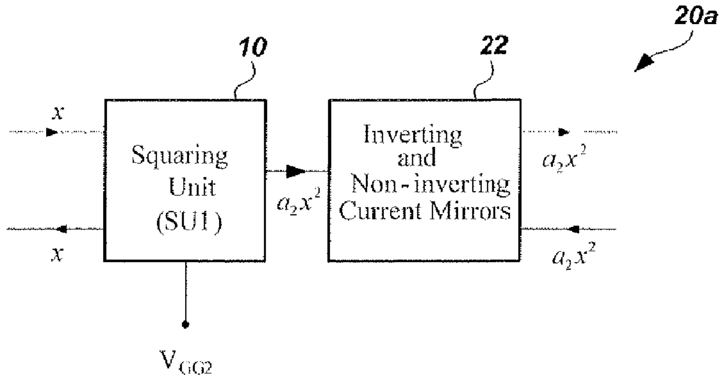
FIG. 2A is a block diagram of a CMOS circuit implementing the $a_2x^2$ term of a Taylor series in a CMOS programmable non-linear function synthesizer according to the present invention.
Figure 2B:
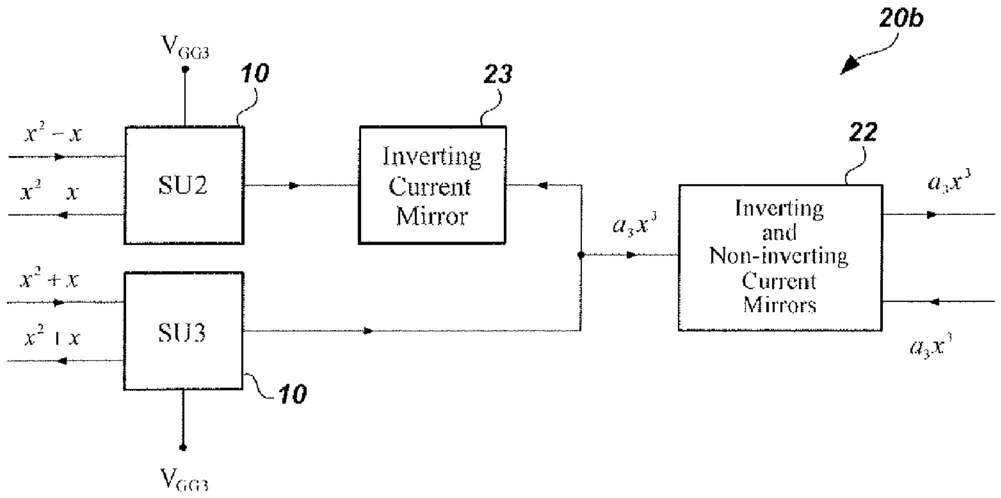
FIG. 2B is a block diagram of a CMOS circuit implementing the $a_3x^3$ term of a Taylor series in a CMOS programmable non-linear function synthesizer according to the present invention.
Figure 2C:
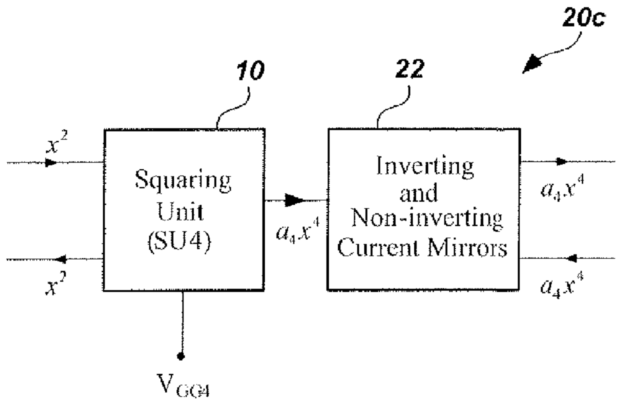
FIG. 2C is a block diagram of a CMOS circuit implementing the $a_4x^4$ term of a Taylor series in a CMOS programmable non-linear function synthesizer according to the present invention.
Figure 2D:
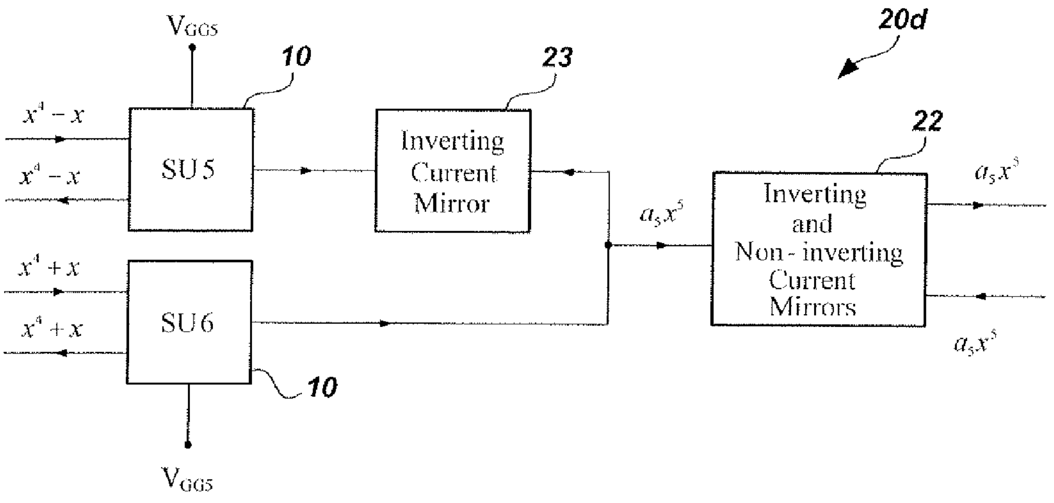
FIG. 2D is a block diagram of a CMOS circuit implementing the $a_5x^5$ term of a Taylor series in a CMOS programmable non-linear function synthesizer according to the present invention.
Figure 2E:
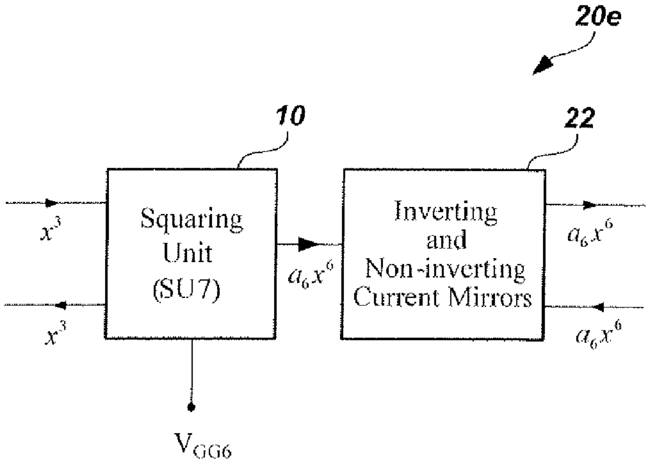
FIG. 2E is a block diagram of a CMOS circuit implementing the $a_6x^6$ term of a Taylor series in a CMOS programmable non-linear function synthesizer according to the present invention.
Figure 2F:
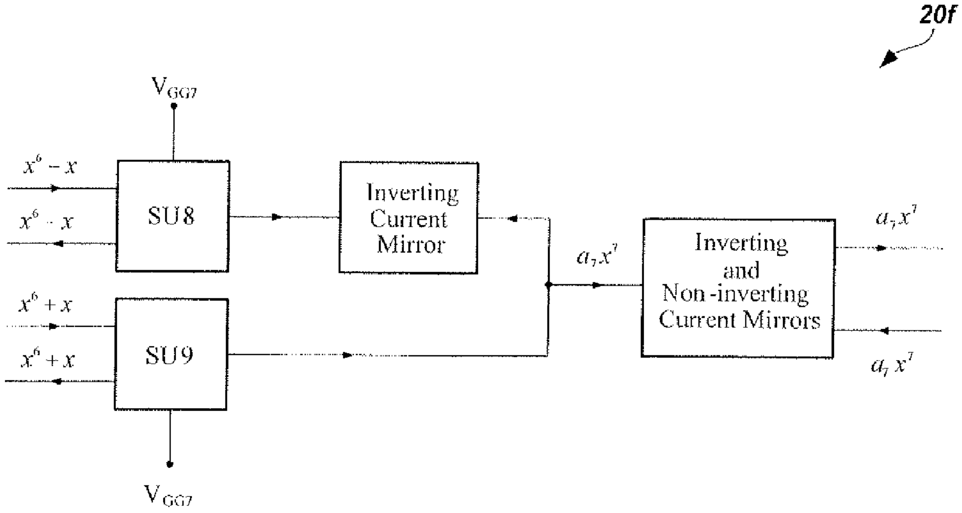
FIG. 2F is a block diagram of a CMOS circuit implementing the $a_7x^7$ term of a Taylor series in a CMOS programmable non-linear function synthesizer according to the present invention.

Inspection of equation (5) clearly shows that the weighting factor of the output current of the squaring circuit 10 of FIGS. 1A-1B can be controlled by adjusting one parameter; the voltage $V_{GG}$. Moreover, using the square-difference identity given by:

$$(A+B)^2-(A-B)^2=4AB \tag{6}$$

then by successive use of the squaring unit 10, in addition to inverting current mirrors 23 and/or inverting and non-inverting current mirrors 22 (as shown in FIGS. 2A-2B, for example) with appropriate values of the MOSFETs' aspect ratios W/L, the required building blocks of power-factor raising circuits with power factors ranging from 3 to 7 for realizing the arbitrary nonlinear functions described by equation (1) can be obtained. Circuit combinations 20*a* through 20*g*, detailed in FIGS. 2A-2G, show possible realizations of the terms $a_2x^2$, $a_3x^3$, $a_4x^4$, $a_5x^5$, $a_6x^6$, and $a_7x^7$. The values of the parameters $a_i$, i=2→7 can be set and programmed by adjusting the gate voltages $V_{GG_i}$, i=2, 3, . . . 6. Inspection of FIGS. 1A and 2A-2G clearly shows that there is a need for current-mirrors and inverting current-mirrors. This can be achieved using the standard class-AB inverting and non-inverting current mirrors 22, as detailed in FIG. 3.

As shown in circuit 400 of FIG. 4, the first term in equation (1), $a_0$, can be realized by a controlled DC current source 404. As shown in FIG. 20, the second term $a_1$x can be realized by the operational transconductance amplifier (OTA)-based current amplifier 200, shown in FIG. 2G. The detailed circuit of OTA 200 is shown in FIG. 2H. Assuming that MN is working in the linear region, the output current of OTA of FIG. 2G can be expressed as:

$$I_{out}=g_mRx. \tag{7}$$

Figure 2G:
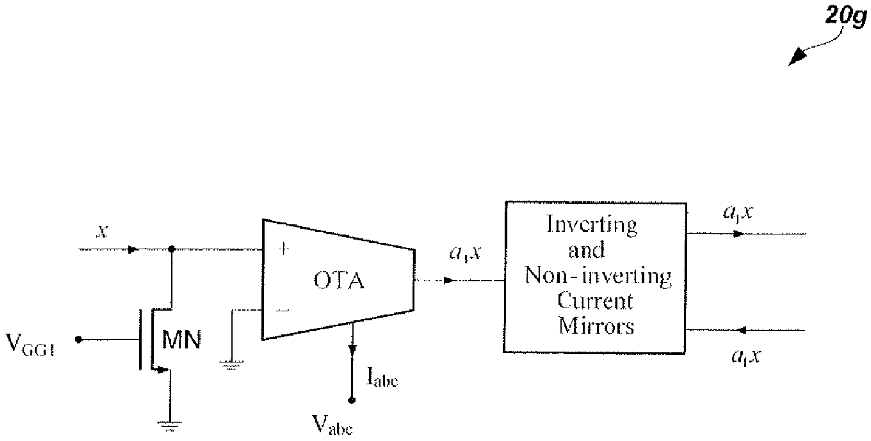
FIG. 2G is a schematic diagram of a CMOS circuit implementing the $a_1x$ term of a Taylor series in a CMOS programmable non-linear function synthesizer according to the present invention.
Figure 2H:
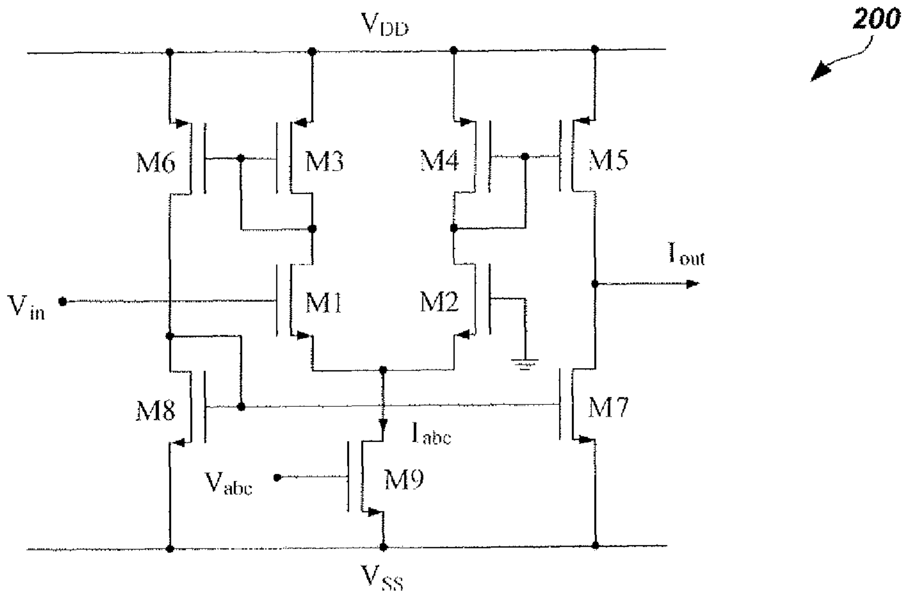
FIG. 2H is a CMOS circuit implementing the OTA (operational transconductance amplifier) used in FIG. 2G.

Combining equations (3) and (7), the output current of FIG. 2G can be expressed as:

$$I_{out}=\frac{g_m}{k(V_{GG_1}-V_{th})^2}x. \tag{8}$$

In equations (7) and (8), the parameter $g_m$ is the transconductance of the OTA 200, and it can be controlled by the auxiliary bias current $I_{abc}$. The variables k and $V_{th}$ are the transconductance parameter and the threshold voltage of the MN transistor of FIG. 2G, respectively. Inspection of equation (8) shows that the weighting factor of the output current can be controlled by adjusting the voltage $V_{GG_1}$ (shown in FIG. 2G). Table III shows the aspect ratios of the transistors used in the OTA 200.

Figure 3:
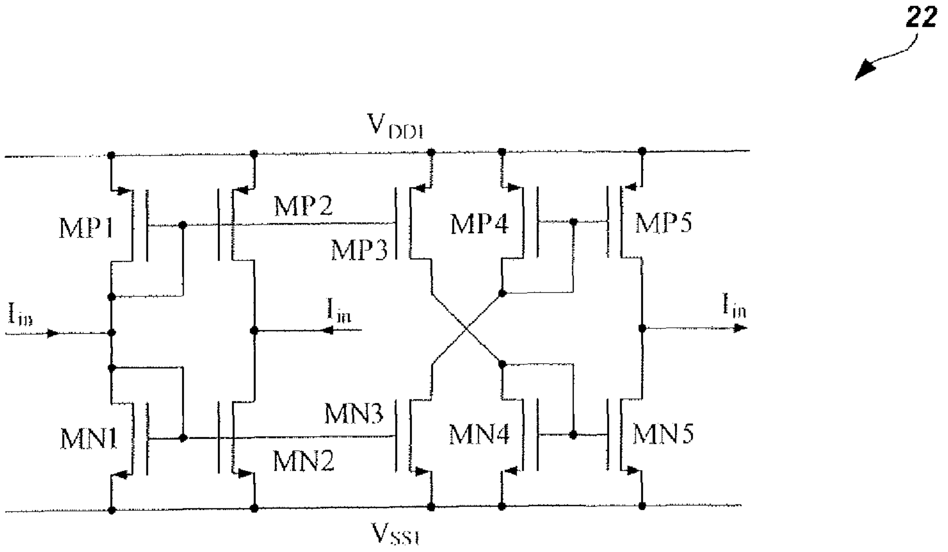
FIG. 3 is a schematic diagram of a CMOS circuit implementing the non-inverting and inverting current mirrors used in FIGS. 2A-2G.

Combining the circuits 20*a* through 20*f* of FIGS. 2A-2F and the circuit 22 of FIG. 3, the block diagram of FIG. 4 presents a functional circuit 400 that realizes the nonlinear function of equation (1). The realized nonlinear function can be changed by proper selection of the positions of switches $S_k$, k=0 to 7 Thus, $a_i$, i=0 to 7 can be a positive, a negative or zero. This paves the way to additional programmability for the realized nonlinear function y(x). The switches $S_0$ through $S_7$ can be programmed using a 2-to-1-of-4 decoder, 2-to 1-of-4 decoders are known in the art.

As a proof of concept, the circuit 400 was used to simulate the nonlinear function of equation (9) using PSPICE with 0.5 μm CMOS parameters.

$$y=0.5x+0.05x^2-0.3x^3+0.8x^4+23.5x^5 \quad (9)$$

The power supply voltages used are $V_{DD}=-V_{SS}=1.5$V, $V_{GG_i}=3.0$V, i=1→5, and $V_{DD1}=V_{SS1}=0.75$V, the aspect ratios of the transistors used in the squaring unit 10 are given in Table I, the aspect ratios of the transistors used in the current-mirror/inverting current-mirrors 22 of FIG. 3 are given in Table II, and the aspect ratios of the transistors used in circuits 20*g* and 200, shown in FIGS. 2G-2H, are given in Table III. Whenever it was found necessary, a load resistance of 10 kΩ was used.

TABLE I

| Aspect ratios of squaring unit transistors in FIG. 1A | |
|---|---|
| Transistor | Aspect Ratio W/L [μm/μm] |
| M1, M2, M3, M4 | 0.55/0.75 |
| M5, M6, M7, M8 | 0.9/0.75 |
| M9, M12 | 16.9/0.75 |
| M10, M11 | 33.75/0.75 |

TABLE II

| Aspect ratios of current mirror transistors in FIG. 3 | |
|---|---|
| Transistor | Aspect Ratio W/L [μm/μm] |
| MP1, MP2, MP3, MP4, MP5 | 150/0.75 |
| MN1, MN2, MN3, MN4, MN5 | 30/0.75 |

TABLE III

| Aspect ratios of the transistors of FIGS. 2G and 2H | |
|---|---|
| Transistor | Aspect Ratio W/L [μm/μm] |
| M1, M2 | 2.5/0.75 |
| M3, M4 | 12.3/0.75 |
| M5, M6 | 4.5/0.75 |
| M7, M8 | 07/0.75 |
| M9 | 21/0.75 |
| MN | 0.9/0.75 |

Figure 5:
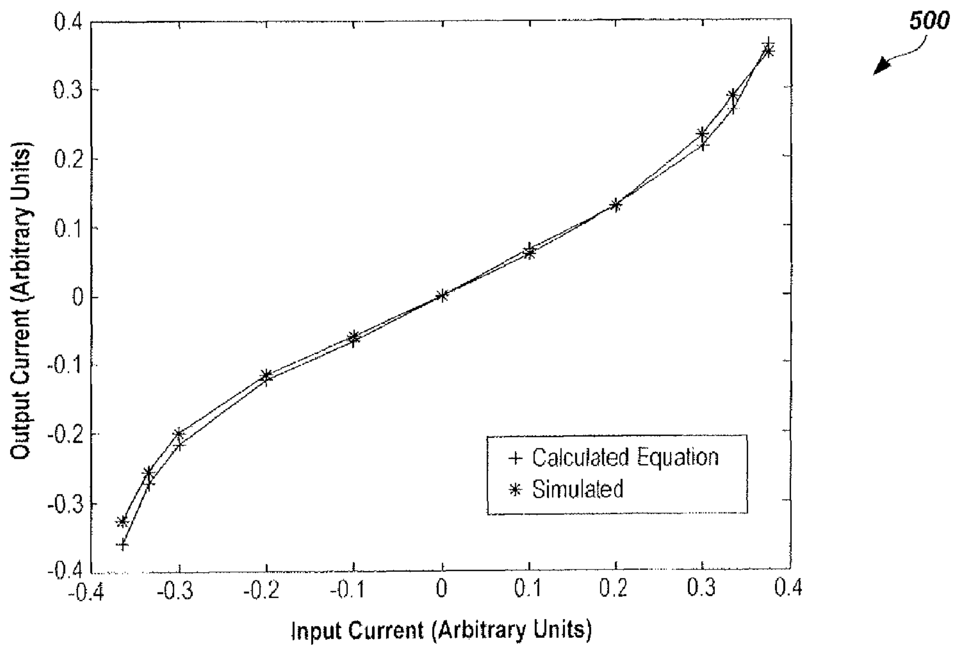
FIG. 5 is an exemplary plot showing Input/Output characteristics of a CMOS programmable non-linear function synthesizer according to the present invention.
Figure 6:
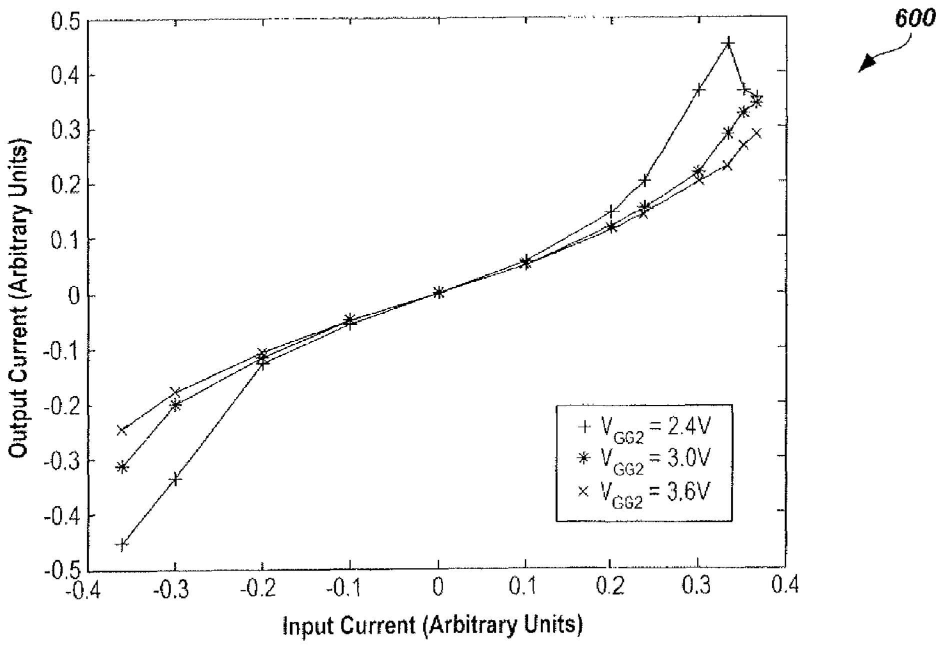
FIG. 6 is another exemplary plot showing Input/Output characteristics of a CMOS programmable non-linear function synthesizer according to the present invention.
Figure 7:
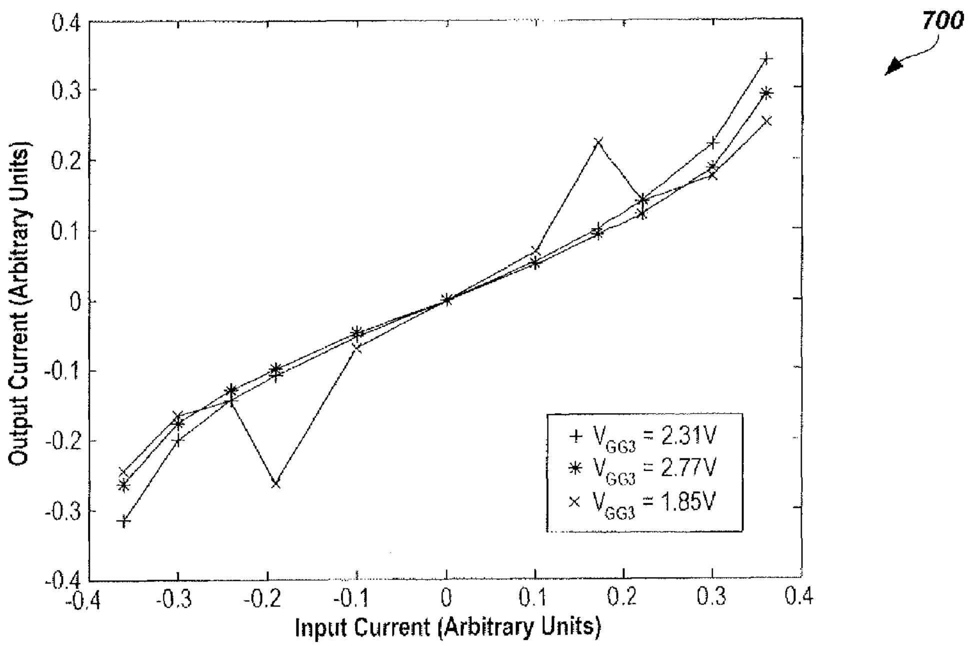
FIG. 7 is a third exemplary plot showing Input/Output characteristics of a CMOS programmable non-linear function synthesizer according to the present invention.
Figure 8:
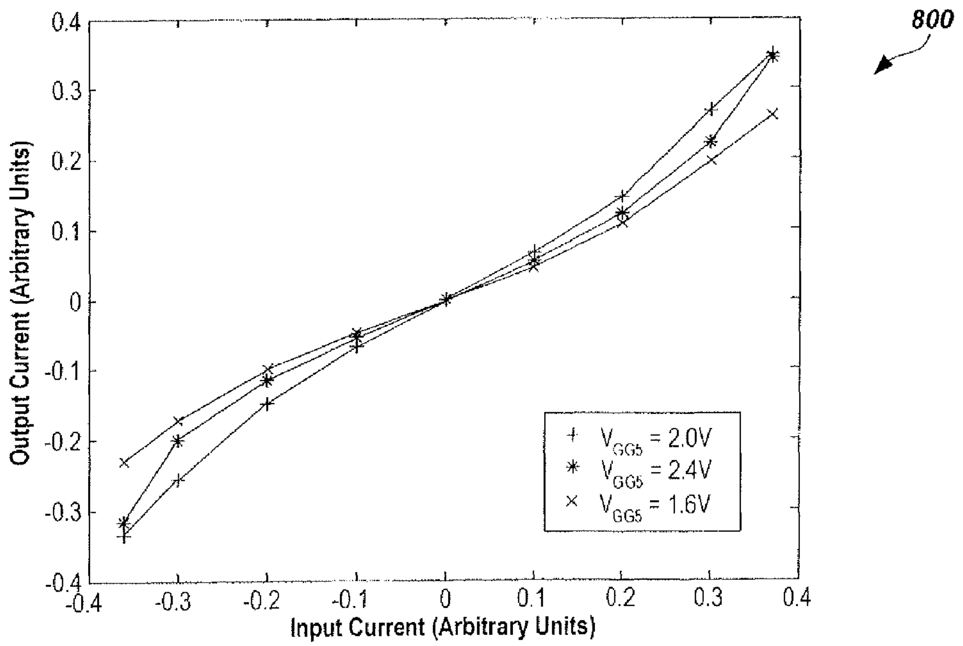
FIG. 8 is a fourth exemplary plot showing Input/Output characteristics of a CMOS programmable non-linear function synthesizer according to the present invention.

The simulation results obtained, together with equation (9), are shown in FIG. 5, plot 500. It is worth mentioning here that the values of the parameters $a_I$, i=1, 2, . . . , 5 in equation (9) were adjusted by fine tuning the values of the voltages $V_{GG_i}$, i=1-5. Inspection of plot 500 clearly shows that the simulated results are in excellent agreement with equation (9). Moreover, by adjusting the voltages $V_{GG_i}$, i=1-5, the parameters $a_i$, i=1-5 can be controlled and different nonlinear functions can be obtained. Samples of the results obtained are shown in plots 600, 700 and 800 of FIGS. 6-8, respectively, for different values of the voltages $V_{GG_i}$, i=1-5.

The circuit of FIG. 4 is based on the assumption that a continuous nonlinear function can be easily approximated using a seventh-order Taylor-series expansion. Each term of the Taylor series expansion is realized using a current-mode basic building block. The weighted output currents of these blocks are added to form the desired analog nonlinear function. The weighting factor of the output current of each block can be controlled using an input voltage. Thus, the synthesized analog nonlinear function can be programmed, and arbitrary functions can be obtained. The proposed approach can be easily expanded to accommodate higher-orders of the Taylor-series expansion, if needed.

It is to be understood that the present invention is not limited to the embodiments described above, but encompasses any and all embodiments within the scope of the following claims.

We claim:

1. A CMOS programmable non-linear function synthesizer, comprising:

a plurality of current squarer circuits having a plurality of MOSFET transistors configured for providing current gain and current mirroring, each of the squarer circuits including a bias circuit controlling the current gain responsive to an external voltage, the current gain responsiveness to the external voltage being characterized by the relation:

$$I_{out} = \frac{k_1}{k_3^2(V_{GG}-V_{th})^2} I_{in}^2,$$

where $V_{GG}$ is a gate voltage operable within the bias circuit, $I_{in}$ is the input current of the current squarer circuit, $k_1$ is a transconductance parameter of the current gain portion of the current squarer circuit, $k_3$ is a transconductance parameter of the bias circuit, and $V_{th}$ is a threshold voltage associated with the formation of the gate voltage, the bias circuit having MOSFET transistors operating in a linear region, the current gain portion of the current squarer circuit having MOSFET transistors operating in a saturation region, the current gain representing at least one term of a Taylor series expansion of a nonlinear function;

successive power-factor raising circuit stages, each of the stages being connected to the current squarer circuits, the successive power-factor raising circuit stages including combinations of inverting and non-inverting current mirrors, the power-factor raising stages each producing a current output;

a variable DC current source;

a summer circuit having a plurality of switches configured to combine currents from the variable DC current source and the plurality of power-factor raising current stages, each of the switches having a first position configured to switch the current for the DC current source or the corresponding power-factor raising stage to a positive current, a second position configured to the current for the DC current source or the corresponding power-factor raising stage to a negative current, and a third position configured to disconnect the current for the DC current source or the corresponding power-factor raising stage from the summer circuit, the switch positions representing sign coefficient weights applied to successive terms of the Taylor series expansion of the nonlinear function of interest;

wherein the total current output of the summer circuit approximates the nonlinear function, the squarer circuits, the power-factor raising circuit stages, and the switch positions being configured to represent weighted power factors corresponding to the plurality of terms in the Taylor-series expansion of the nonlinear function.

2. The CMOS programmable non-linear function synthesizer according to claim 1, wherein:

the plurality of MOSFETS in said current gain portion of said current squarer circuits have aspect ratios (w/L) of about 0.55/0.75;

said current mirroring portion of said current square circuits comprises a first stage current mirror including MOSFETs having an aspect ratio (w/L) of about 16.9/0.75, and a second stage current mirror including MOSFETs having an aspect ratio (w/L) of about 33.75/0.75.

3. The CMOS programmable non-linear function synthesizer according to claim 1, wherein the MOSFETS in the bias circuits of said current squarer circuits have an aspect ratio (w/L) of about 0.9/0.75.

4. The CMOS programmable non-linear function synthesizer according to claim 1, wherein said power-factor raising circuit stages have an integer power factor range between three and seven inclusive.

5. The CMOS programmable non-linear function synthesizer according to claim 4, wherein the non-linear function is characterized by the relation:

$$f(x) \cong y = a_0 + a_1x + a_2x^2 + a_3x^3 + a_4x^4 + a_5x^5 + a_6x^6 + a_7x^7 + \ldots a_nx^n \text{ where } |x| < 1.$$

6. The CMOS programmable non-linear function synthesizer according to claim 5, wherein said combinations of inverting and non-inverting current mirrors are configured for class AB operation.

7. The CMOS programmable non-linear function synthesizer according to claim 6, wherein said inverting and non-inverting current mirrors comprise a first plurality of CMOS transistors having an aspect ratio (w/L) of about 150/0.75 and a second plurality of CMOS transistors having an aspect ratio (w/L) of about 30/0.75.

8. The CMOS programmable non-linear function synthesizer according to claim 7, wherein at least one of said successive power-factor raising circuit stages comprises an operational transconductance amplifier (OTA) stage having a plurality of aspect ratios (w/L) selected to obtain a current having a value realizing the $a_ix$ term of the Taylor series expansion.

9. The CMOS programmable non-linear function synthesizer according to claim 8, wherein the $a_1x$ term comprises said OTA as input to a first of said inverting and non-inverting current mirrors.

* * * * *